United States Patent [19]

Southwick et al.

[11] Patent Number: 5,422,225
[45] Date of Patent: Jun. 6, 1995

[54] PHOTOPOLYMERIZABLE RECORDING COMPOSITION FOR WATER-WASHABLE PRINTING PLATES CONTAINING A WATER-DISPERSIBLE ELASTOMERIC POLYMER BLEND

[75] Inventors: Jeffrey G. Southwick, Houston; Robert C. Bening, Katy; John D. Wilkey, Houston, all of Tex.

[73] Assignee: Shell Oil Company, Houston, Tex.

[21] Appl. No.: 264,822

[22] Filed: Jun. 23, 1994

[51] Int. Cl.$^6$ ............................ G03C 1/73; G03F 7/031
[52] U.S. Cl. ................................. 430/270; 430/286; 522/112; 522/150; 522/153; 522/158; 522/160
[58] Field of Search ............... 522/112, 153, 150, 158, 522/160; 526/306; 430/270, 286; 525/89, 88

[56] References Cited

U.S. PATENT DOCUMENTS

| | | | |
|---|---|---|---|
| 3,877,939 | 4/1975 | Okai | 96/36.3 |
| 4,112,207 | 9/1978 | Jones | 526/17 |
| 4,385,109 | 5/1983 | Lechtken et al. | 430/306 |
| 4,427,754 | 1/1984 | Uchida et al. | 430/60 |
| 4,460,675 | 7/1984 | Gruetzmacher et al. | 430/300 |
| 4,478,931 | 10/1984 | Fickes et al. | 430/309 |
| 4,521,503 | 6/1985 | Herbert | 430/49 |
| 4,557,994 | 12/1985 | Nagano et al. | 430/162 |
| 4,622,088 | 11/1986 | Min | 156/244.11 |
| 4,948,699 | 8/1990 | Nishimoiri et al. | 430/204 |
| 4,952,481 | 8/1990 | Seio et al. | 430/284 |
| 4,957,850 | 9/1990 | Kusuda et al. | 430/271 |
| 5,002,676 | 3/1991 | Willis et al. | 526/329 |
| 5,041,348 | 8/1991 | Kato et al. | 430/49 |
| 5,077,165 | 12/1991 | Kato et al. | 430/49 |
| 5,120,633 | 6/1992 | Bauer et al. | 430/176 |
| 5,178,961 | 1/1993 | Faust et al. | 428/463 |
| 5,292,795 | 3/1994 | Southwick et al. | 524/562 |

FOREIGN PATENT DOCUMENTS

| | | |
|---|---|---|
| 0183552 | 6/1986 | European Pat. Off. . |
| 0480335 | 4/1992 | European Pat. Off. . |
| 0480336 | 4/1992 | European Pat. Off. . |
| 0489553 | 6/1992 | European Pat. Off. . |
| 62138845 | 6/1987 | Japan . |
| 92067514B | 10/1992 | Japan . |

*Primary Examiner*—Susan W. Berman
*Attorney, Agent, or Firm*—Donald F. Haas

[57] ABSTRACT

A photopolymerizable recording composition for water-washable printing plates, which comprises:

(a) a water dispersible elastomeric blend of at least 20 percent by weight of an A-B-M-B-A block copolymer and an A-B-M block copolymer, wherein A is a vinyl aromatic hydrocarbon block, B is a conjugated diene block and M is an acrylic monomer block containing acid groups, and (b) a photopolymerization initiator.

2 Claims, No Drawings

PHOTOPOLYMERIZABLE RECORDING COMPOSITION FOR WATER-WASHABLE PRINTING PLATES CONTAINING A WATER-DISPERSIBLE ELASTOMERIC POLYMER BLEND

BACKGROUND OF THE INVENTION

The present invention relates to water-washable printing plates. More particularly, it relates to a novel photopolymerizable recording composition for water-washable printing plates which contains a water-dispersible elastomeric polymer blend.

Photopolymerizable recording compositions used for the preparation of printing plates and relief plates have been frequently described and include both liquids which can be cured to form the final plate and solids. It is especially desirable to use photopolymerizable compositions capable of producing final printing plates that are easily developed yet sufficiently hard to enable repeated use. Organic solvents or aqueous alkaline solutions have generally been used in the preparation and developing of such photopolymer plates. The developing process for such plates is complex because the preparation of the developing chemicals is complicated and gives rise to a host of problems that cannot easily be avoided. One way to avoid these problems is to use a photopolymerizable composition which is developable with plain water. There are water-developable compositions available, for example see U.S. Pat. No. 3,877,939, and these compositions help avoid potential poisoning to workers and drainage problems inherent with the use of harsh developing liquids.

Prior art water-developable photopolymerizable compositions are generally characterized by water dispersible resin coatings onto metallic plates or mixtures of a water sensitive polymer with an elastomeric rubber matrix. European patent application 0,480,335 describes a light-curable elastomeric mixture useful in relief printing plates. That composition utilizes an elastomeric binder which is a blend of a styrene-isoprene-methacrylic acid block copolymer and a styrene-isoprene-styrene block copolymer, although the examples show the use of chlorosulfonated polyethylene, polyisoprene and epoxidized polybutadiene in place of the styrene-isoprene-styrene block copolymer. The copolymer containing the methacrylic acid is made by a process which requires termination or capping of the block copolymer with diphenyl ethylene before adding acrylic monomer. Diphenyl ethylene is expensive and not readily available. This block copolymer assists in the water dispersibility of the blend but the styrene-isoprene-styrene block copolymer is not as easily water dispersible.

The present invention provides a photopolymerizable recording composition containing a water-dispersible elastomeric polymer blend which is a natural result of the polymerization and the processing of the elastomer, can be made in one polymerization, and which is more easily water dispersible than the blend of EP 0,480,335.

SUMMARY OF THE INVENTION

The present invention is a photopolymerizable recording composition for water-washable printing plates which comprises (a) a water-dispersible elastomeric blend of at least 20 percent by weight of an A-B-M-B-A block copolymer and an A-B-M block copolymer, wherein A is a vinyl aromatic hydrocarbon block, B is a conjugated diene block and M is an acrylic monomer block containing acid or anhydride groups; and (b) a photopolymerization initiator.

DETAILED DESCRIPTION OF THE INVENTION

The polymers which may be used according to the present invention are polymers of vinyl aromatic hydrocarbons, conjugated dienes and acrylic monomers such as hydrolyzed alkyl methacrylates or anhydride derivatives thereof. Other suitable acrylic monomers include acrylates, such as t-butyl acrylate; cyclic alkyl methacrylates, such as 2,5-dimethylcyclohexyl methacrylate; and acrylates in which the alkyl group contains an ether linkage, such as tetrahydrofuran acrylate. The acrylic monomer block in the copolymer must contain acid groups or anhydride groups that readily convert to acid groups in the presence of water in order to enhance the water dispersibility of the copolymer. The vinyl aromatic hydrocarbon block provides strength and the diene block provides the elastomeric character which is important because it is important for the printing plate to be soft enough to conform and transfer ink to an uneven surface, but must rebound to its original dimensions to assure good print quality throughout repeated pressings.

Such block copolymers may be multiblock copolymers of varying structures containing various ratios of the monomers including those containing up to about 60 percent by weight of vinyl aromatic hydrocarbon. At higher vinyl aromatic hydrocarbon contents, the polymers are not elastomeric and therefore not desirable as a printing plate material.

The polymers used in the photopolymerizable recording composition of the present invention are a mixture of polymers with at least five discrete blocks and 3-block polymers. For 5-block polymers there are two exterior blocks of a vinyl aromatic hydrocarbon, preferably styrene, two interior blocks of a conjugated diene and a central block of an acrylic monomer. Three block polymers have the conjugated diene block positioned between blocks of a vinyl aromatic hydrocarbon block and an acrylic block. The acrylic blocks should contain at least 50 percent of acid or anhydride groups. The acid groups may be provided in the polymer by hydrolyzing the acrylic monomer block with acid catalysis in toluene solution. Anhydride groups are formed in the particular case where the acrylic block is a block of tert-butylmethacrylate, by heating the polymer above 220° C. for at least 45 minutes. This anhydride readily converts to methacrylic acid upon contact with water.

The block copolymers may be produced by any well known block polymerization or copolymerization procedures including the well-known sequential addition of monomer techniques, or incremental addition of monomer technique. As is well known in the block copolymer art tapered copolymer blocks can be incorporated in the multiblock copolymer by copolymerizing a mixture of conjugated diene and vinyl aromatic hydrocarbon monomers utilizing the difference in their copolymerization reactivity rates. The manufacture of such polymers containing alkyl methacrylates is described in U.S. Pat. No. 5,002,676 and in U.S. Pat. No. 5,194,510 both of which are herein incorporated by reference.

In this case, an A-B-M block copolymer is made by polymerizing a vinyl aromatic hydrocarbon, then polymerizing a conjugated diene on the end and finally polymerizing an acrylic monomer on the end of the conjugated diene block. However, methacrylate also functions as a coupling age producing A-B-M-B-A polymers. This coupling process is a competing reaction to the propagation of a methacrylate block, and is normally not 100 percent efficient. The final product generally contains some uncoupled A-B-M polymer. In the present case, the blend generally contains from 20 to 60 precent by weight of the five block polymer with the rest being uncoupled three block polymer arms. This blend provides a perfectly acceptable water-dispersible product which can be used in the photopolymerizable recording composition of the present invention. However, it is important that at least 20 percent by weight of the blend be the five block polymer because lower levels will produce an unacceptably weak elastomer.

Conjugated dienes which may be utilized to prepare the polymers and copolymers include those having from 4 to 8 carbon atoms and also include 1,3-butadiene, 2-methyl-1, 3-butadiene(isoprene), 2,3-dimethyl-1,3-butadiene, 1,3-pentadiene, 1,3-hexadiene and the like. Mixtures of such conjugated dienes may also be used. The preferred conjugated dienes are 1,3-butadiene and isoprene.

Vinyl aromatic hydrocarbons which may be utilized to prepare copolymers include styrene, o-methylstyrene, p-methylstyrene, p-tert-butylstyrene, 2,4-dimethylstyrene, alpha-methylstyrene, vinylnapthalene, vinylanthracene and the like. The preferred vinyl aromatic hydrocarbon is styrene.

Alkyl methacrylates are preferred for use herein and those employed herein include methacrylates wherein the alkyl group has up to 14 carbon atoms inclusive. Derivatives of these polymers such as, for example, anhydrides, polymers with partially or completely acidified methacrylate groups, and the like are the form in which the M polymer block must be when it is used in the composition of present invention. Derivatives of alkyl methacrylates include methacrylic acid, methacrylic acid salts (for example, zinc, sodium and quaternary ammonium salts), and anhydrides formed between adjacent acid units by heating. It should be noted that derivatization of the methacrylate group can be carried out prior to adding the polymer to the photoinitiator or in situ after the polymer is added to the photoinitiator. An especially advantageous process will convert the methacrylate block from the ester form to the anhydride form while the polymer is being produced as a solid pellet in a devolatilizing extruder. The in situ reaction requires a reactive ester group such as t-butyl or 1,1-dimethyl alkyl ester. Catalysts such as acids and bases can be added to aid the in situ conversion. Illustrative of such methacrylate esters are methyl methacrylate, ethyl methacrylate, sec-butyl methacrylate, t-butyl methacrylate, i-amyl methacrylate, hexyl methacrylate, decyl methacrylate and dodecyl methacrylate. Largely because of ease of polymerization, the preferred alkyl methacrylates are branched-butyl methacrylates, i.e., iso-butyl methacrylate and t-butyl methacrylate. The desired poly(alkyl methacrylate) block is produced by directly polymerizing the corresponding alkyl methacrylate monomer or alternatively the desired block is obtained by polymerizing a more easily polymerizable methacrylate and subsequently transesterifying the product to introduce the desired alkyl group. Tertiary butyl methacrylate (TBMA) is preferred because of ease of purification and polymerization.

The present invention encompasses polymers which are both high and low in molecular weight, as well as in between. High molecular weight polymers include those up to several million molecular weight as defined by gel permeation chromatography (GPC) peak molecular weight of the main species. Low molecular weight polymers include those of only 1000 molecular weight or even less.

The molecular weights of these polymers generally range from 1,000 to 1,000,000, preferably from 40,000 to 200,000. The vinyl aromatic hydrocarbon block molecular weight generally ranges from 4,000 to 30,000 and the conjugated diolefin block molecular weight generally ranges from 20,000 to 175,000. The molecular weight of the acrylic monomer block should be in the range from 100 to 50,000 because 100 represents the molecular weight of one unit and molecular weights greater than 50,000 are probably not needed to impart water dispersancy.

Molecular weights of linear polymers or unassembled linear segments of polymers such as mono-, di-, or triblock, etc., arms of star polymers before coupling are conveniently measured by Gel Permeation Chromatography (GPC), where the GPC system has been appropriately calibrated. For polymers of the type described herein, the appropriate standard is a narrow molecular weight polystyrene standard. For anionically polymerized linear polymers, the polymer is essentially monodisperse and its both convenient and adequately descriptive to report the "peak" molecular weight of the narrow molecular weight distribution observed. The peak molecular weight is usually the molecular weight of the main species shown on the chromatograph. For materials to be used in the columns of the GPC, styrene-divinyl benzene gels or silica gels are commonly used and are excellent materials. Tetrahydrofuran is an excellent solvent for polymers of the type described herein. Ultraviolet or refractive index detectors may be used. The following references are herein incorporated by reference:

1. *Modern Size-Exclusion Liquid Chromatography*, M. W. Yau, J. J. Kirkland, D. D. Bly, John Wiley and Sons, New York, N.Y., 1979.
2. *Light Scattering From Polymer Solutions*, M. B. Huglin, ed., Academic Press, New York, N.Y., 1972.
3. W. K. Kai and A. J. Havlik, *Applied Optics*, 12, 541 (1973).
4. M. L. McConnell, *American Laboratory*, 63, May, 1978.

The acrylic monomer content of the polymer is generally no more than about 3 percent but acrylic monomer contents of up to 70% are possible. Generally, the acrylic monomer may be present in the polymer in an amount from about 1 percent to about 15 percent because lower amounts will not provide the advantages of the present invention and higher amounts are not advantageous from a cost standpoint. All percentages expressed above are weight percentages based on the total weight of the block copolymer.

It is essential to the performance of the present invention that the block copolymers used herein have sufficient acrylic monomer to provide sufficient polar-type functionality to provide enhanced dispersibility in water relative to block polymers of conjugated dienes and/or vinyl aromatic hydrocarbons which do not contain such acrylic monomers in the polymer backbone. It is theorized that the presence of sufficient amounts of acrylic monomer in the polymer backbone increases the dispersibility in water due to collective interactions of the monomer with water such as hydrogen bonding and dipolar interactions.

Any photopolymerization initiator which is known to work well for block copolymers of vinyl aromatic hydrocarbons and conjugated dienes may be used as the photopolymerization initiator in the photopolymerizable recording composition of the present invention. Suitable photoinitiators include anthraquinone compounds, benzoin alkylate compounds, alkylphosphine oxide compounds as described in U.S. Pat. No. 4,385,109 which is herein incorporated by reference. Specific preferred photoinitiators include acylphosphine oxides, acylphosphonic acid esters, benzoin alkylates with 1 to 8 carbon atoms, and anthroquinones. The photoinitiator is generally used in an amount from about 0.5 to about 3.0 weight percent because smaller amounts are ineffective, and larger amounts are not economical.

Such photopolymerizable compositions often contain one or more monomers which contain one or more photopolymerizable olefinically unsaturated double bonds. Such monomers are described in U.S. Pat. Nos. 3,877,939 and 4,385,109 which are herein incorporated by reference. Such monomers include acrylic or methacrylic esters of lower alcohols having one or more hydroxy groups, acrylic or methacrylic esters of polyethylene glycol, or amides of acrylic or methacrylic acid, fumaric acid, or maleic acid with a mono- or polyfunctional amine.

It may be advantageous to add to the photopolymerizable compositions the conventional amounts of known thermal polymerization inhibitors, for example, hydroquinone, p-methoxyphenol, m-dinitrobenzene, p-quinone, methylene blue, beta-naphthol, n-nitroamines, esters of phosphoric o acid, or salts, especially alkali metal salts and aluminum salts, of N-nitrosocyclohexylhydroxylamine. The compositions can also contain other conventional additives, for example, plasticizers, saturated low molecular weight compounds containing amide groups, waxes and the like.

The photopolymerizable recording compositions can be processed by conventional methods into, for example, photopolymer printing plates having the recording composition as the relief-forming layer. The precise method depends on the nature of the blend. The recording compositions are processed into relief plates in the conventional manner by image-wise exposure to actinic light, using light sources which have emission maxima in the absorption range of the photoinitiator, in general in the range from 200 to 500 nm and particularly from 230 to 450 nm, or which emit light of which a sufficient proportion is within this wavelength range, such as actinic or super actinic fluorescent tubes, low-pressure, medium-pressure and high-pressure mercury vapor lamps, which may or may not be doped, and xenon lamps.

After image-wise exposure, the unexposed areas of the layer of recording composition are removed in the conventional manner, either mechanically or by washing out with a suitable developer solution, and the resulting plate is dried. In the present situation, the developer solution may be water based and may include an amount of alcoholic cosolvent. The photopolymerizable recording compositions are distinguished by high reactivity on exposure, thus enabling the exposed areas of the layer to cure rapidly. Other advantages of the compositions of the present invention include increased water dispersibility of the base polymer blend. Further, the base polymer blend is simply made with one polymerization, use readily available commercial monomers.

EXAMPLE 1

Polymer A was made by anionically polymerizing styrene and isoprene, and then adding t-butyl methacrylate (TBMA), which results in a blend of 33% coupled S—I-M-I—S polymer, and 67% uncoupled S—I-M polymer. The styrene block molecular weights were 11,000, the isoprene block molecular weight was 99,000, and the triblock TBMA block molecular weight was 4000. Another such block polymer having a TBMA block of 15,000 molecular weight was also made. The molecular weights of the other blocks are the same. This is Polymer C. These polymers were converted to methacrylic acid polymers by adding 0.3 mole percent of paratoluene sulfonic acid per mole of ester in the polymer to a solution of 15 weight percent polymer in toluene. This was stirred for 1 hour at 110° C. with a nitrogen sparge. The polymer was cooled, poured into methanol to coagulate it, and then dried.

The polymers were evaluated for suitability in water-based printing plate systems by determining how much dilute base was absorbed by a plaque of the polymer in 24 hours. Dilute base is one possible developing fluid for printing plates. Polymer A was compared in this characteristic to a 35 percent coupled styrene-isoprene-styrene (block molecular weights-15,500-180,000-15,500) block copolymer, Polymer B. A number of samples of each polymer were used. Polymer C was also tested in this manner. The increase in weight and percent increase in weight of each of the polymer samples is shown in Table 1 below:

TABLE 1

| | | | "SWELL" TESTING | | | | |
|---|---|---|---|---|---|---|---|
| POLYMER | % NH4+ SOLUTION | TIME HOURS | PRE-WEIGHT GRAMS | POST-WEIGHT GRAMS | % INCREASE IN WEIGHT | 3 DAYS DRY GRAMS | % INCREASE IN WEIGHT |
| Polymer B* | 0.18 | 24 | 17.0523 | 17.0918 | 0.23 | 17.0532 | 0.01 |
| Polymer B** | 0.5 | 24 | 8.7918 | 8.7986 | 0.08 | 8.7858 | −0.07 |
| | | | 8.7843 | 8.7899 | 0.06 | 8.7763 | −0.09 |
| | | | 8.0646 | 8.0722 | 0.09 | 8.0591 | −0.07 |
| | | | 8.1090 | 8.1169 | 0.10 | 8.1048 | −0.05 |
| | | | 8.9060 | 8.9142 | 0.09 | 8.8995 | −0.07 |
| | | | 8.2909 | 8.2996 | 0.10 | 8.2849 | −0.07 |
| | | | 7.9971 | 8.0049 | 0.10 | 7.9919 | −0.07 |
| | | | 7.7185 | 7.7264 | 0.10 | 7.7134 | −0.07 |
| Polymer A* | 0.18 | 24 | 17.9442 | 18.0583 | 0.64 | 17.987 | 0.24 |
| Polymer A** | 0.5 | 24 | 8.0765 | 8.1129 | 0.45 | 8.0944 | 0.22 |
| | | | 8.5155 | 8.5399 | 0.29 | 8.5157 | 0.00 |
| | | | 7.6103 | 7.6418 | 0.41 | 7.6255 | 0.20 |
| | | | 7.0387 | 7.0689 | 0.43 | 7.0525 | 0.20 |

TABLE 1-continued

| POLYMER | % NH4+ SOLUTION | TIME HOURS | "SWELL" TESTING | | | | |
|---|---|---|---|---|---|---|---|
| | | | PRE-WEIGHT GRAMS | POST-WEIGHT GRAMS | % INCREASE IN WEIGHT | 3 DAYS DRY GRAMS | % INCREASE IN WEIGHT |
| | | | 8.0067 | 8.0404 | 0.42 | 8.0209 | 0.18 |
| | | | 6.0542 | 6.0887 | 0.57 | 6.0691 | 0.25 |
| | | | 8.1352 | 8.1505 | 0.19 | 8.1275 | −0.09 |
| | | | 8.4045 | 8.4249 | 0.36 | 8.4077 | 0.04 |
| Polymer C* | 0.18 | 24 | 17.1264 | 17.1834 | 0.33 | 17.1523 | 0.15 |

*Plaque Size: 4¼ × 2½ × ⅛
**Plaque Size: 2⅜ × 1¼ × ⅛

It can clearly be seen that the increase in weight for the methacrylic acid-containing polymers are much greater than the increase in weight for the S—I—S block copolymer. Even though the absolute difference is small, the difference is statistically significant. These results indicate that the methacrylic acid block-containing copolymers would exhibit much better water dispersibility than the other block copolymer and thus would be more useful in printing plate applications.

We claim:

1. A photopolymerizable recording composition for water-washable printing plates, which comprises:
    (a) a water dispersible elastomeric blend of at least 20 percent by weight of an A-B-M-B-A block copolymer and an A-B-M block copolymer, wherein A is a vinyl aromatic hydrocarbon block, B is a conjugated diene block and M is an acrylic monomer block containing acid groups, and
    (b) a photopolymerization initiator.

2. The composition of claim 1 wherein A is styrene, B is isoprene or butadiene and M is an alkyl methacrylic acid.

* * * * *